(12) United States Patent
Ishida et al.

(10) Patent No.: US 6,316,319 B1
(45) Date of Patent: Nov. 13, 2001

(54) METHOD OF MANUFACTURING A SEMICONDUCTOR DEVICE HAVING SHALLOW JUNCTIONS

(75) Inventors: Emi Ishida, Sunnyvale; Dong-Hyuk Ju, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/357,330

(22) Filed: Jul. 20, 1999

(51) Int. Cl.$^7$ .................................................. H01L 21/336
(52) U.S. Cl. ....................... 438/299; 438/303; 438/305; 438/592; 438/664
(58) Field of Search ...................... 438/531, 585, 438/592, 655, 658, 664, 303, 299, 301, 305, 306

(56) References Cited

U.S. PATENT DOCUMENTS 5,956,584 * 9/1999 Wu ........................................ 438/232
6,087,234 * 7/2000 Wu ........................................ 438/299

* cited by examiner

*Primary Examiner*—Carl Whitehead, Jr.
*Assistant Examiner*—Toniae M. Thomas

(57) ABSTRACT

A semiconductor device with shallow junctions is obtained by forming shallow source/drain extensions followed by forming a film over the gate electrode and the semiconductor substrate. The film is formed having a targeted thicknesses to facilitate gate electrode doping and source/drain formation. Ion implantation is then conducted to fully dope the gate electrode and form moderately or heavily doped source/drain implants, thereby reducing gate depletion.

15 Claims, 4 Drawing Sheets

METHOD OF MANUFACTURING A SEMICONDUCTOR DEVICE HAVING SHALLOW JUNCTIONS

TECHNICAL FIELD

The present invention relates to a method of manufacturing high density semiconductor devices having shallow junctions. The present invention is particularly applicable in manufacturing high density CMOS semiconductor devices with design features of 0.25 microns and under.

BACKGROUND ART

The escalating requirements for high density and performance associated with ultra large scale integration semiconductor devices require design features of 0.25 microns and under, increased transistor and circuit speeds, high reliability and increased manufacturing throughput. The reduction of design features to 0.25 microns and under challenges the limitations of conventional semiconductor methodology.

Conventional semiconductor devices typically comprise a semiconductor substrate, normally doped monocrystalline silicon, and a plurality of interleaved dielectric and conductive layers formed thereon. In a conventional semiconductor device 100 illustrated in FIG. 1, substrate 1 is provided with field oxide 2 for isolating an active region comprising source/drain regions 3, and a gate electrode 4, typically of doped polysilicon, above the semiconductor substrate with gate oxide 5 therebetween. Interlayer dielectric layer 6, typically silicon dioxide, is then deposited thereover and openings formed by conventional photolithographic and etching techniques. The openings are filled with conductive material to establish electrical contact between subsequently deposited conductive layer 8, and source/drain regions 3 through contacts 7, and to transistor gate electrode 49. Dielectric layer 9, typically silicon dioxide, is deposited on conductive layer 8, and another conductive layer 10, typically aluminum or an aluminum-base alloy, formed on dielectric layer 9 and electrically connected to conductive layer 8 through vias 11.

With continued reference to FIG. 1, conductive layer 10 is the uppermost conductive layer and, hence, constitutes the wire bonding layer. Dielectric layer 12, also typically silicon dioxide, is deposited, and a protective dielectric scratch resistant topside layer 13 deposited thereon. Protective dielectric layer 13 typically comprises a nitride layer, such as silicon nitride ($Si_3N_4$). Alternatively, protective dielectric layer 13 may comprise a dual topcoat comprising a nitride layer on an oxide layer. The protective dielectric layer 13 provides scratch protection to the semiconductor device and protection against moisture and impurity contamination during subsequent processing. After deposition of protective dielectric layer 13, conventional photolithographic etching techniques are employed to form an opening to expose wire bonding layer 10 for external connection by means of bonding pad 14 and electrically conductive wires 15 or an external connection electrode (not shown).

Although only two conductive layers 8 and 10 are depicted in FIG. 1 for illustrative convenience, conventional semiconductor devices are not so limited and may comprise more than two conductive layers, depending on design requirements, e.g., five conductive metal layers. Also in the interest of illustrative convenience, FIG. 1 does not illustrate any particular type of plug or barrier layer technology. However, such technology is conventional and, therefore, the details of such features are not set forth herein.

As device features continually shrink in size, it becomes necessary to decrease the depth of the source and drain regions in the semiconductor substrate, i.e., the junction depth. For example, in forming a polycrystalline silicon gate electrode having a width of about 0.25 microns, the junction depth ($X_J$) should be no greater than about 800 Å. This objective is extremely difficult to achieve, particularly when implanting impurities to dope the gate electrode and form source/drain regions.

For example, conventional semiconductor methodology comprises doping polysilicon gate electrode 4 and forming source/drain regions 3 in the same ion implantation. That is, the ion implantation to form source/drain regions 3 also functions to dope polysilicon gate electrode 4. However, in order to achieve shallow source/drain junctions, the implantation energy for forming source/drain regions 3 is relatively low. The implanted impurities achieve desirably shallow penetration in substrate 1 at the expense of shallow penetration in gate electrode 4. This causes gate depletion, i.e., lack of carriers at the gate electrode/gate oxide interface, resulting in decreased capacitance and reduced drive current.

Ion implantation can be performed at higher energy levels to reduce gate depletion. However, after activation annealing, the resulting source/drain regions extend considerably beyond the targeted maximum $X_J$ of about 800 Å. An undesirably deep Xi can cause short channel effects, generating a leakage current which degrades the performance of the semiconductor device.

SUMMARY OF THE INVENTION

There exists a need exists for a method of manufacturing a semiconductor device having shallow junctions and adequately doped gate electrodes.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method of manufacturing a semiconductor device. The method includes forming a dielectric layer on an upper surface of a semiconductor substrate and forming a silicon layer on the dielectric layer. The method also includes patterning the silicon layer to form a gate electrode having an upper surface and side surfaces and implanting impurities, using the gate electrode as a mask, to form source/drain extension implants in the semiconductor substrate. The method further includes depositing and etching an insulating layer to form sidewall spacers on the side surfaces of the gate electrode. Additionally, the method includes depositing a metal on the semiconductor device and reacting the metal with silicon in the gate electrode and in the semiconductor substrate to form a metal-silicide layer on the gate electrode and on the semiconductor substrate, before activation annealing the source/drain extension implants.

Another aspect of the present invention is a method of manufacturing a semiconductor device that includes forming a dielectric layer on an upper surface of a monocrystalline semiconductor substrate, forming a polycrystalline silicon layer on the dielectric layer and patterning the silicon layer to form a gate electrode. The method also includes implanting impurities to form source/drain extension implants in the semiconductor substrate, depositing an insulating layer and etching the insulating layer to form sidewall spacers on the side surfaces of the gate electrode. The method further includes forming a film having a first thickness over the gate electrode and a second thickness over the semiconductor substrate and implanting impurities to form moderately or heavily doped implants in the semiconductor substrate and to dope the gate electrode.

Other advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout.

DESCRIPTION OF THE INVENTION

The present invention addresses and solves problems associated with forming transistors having shallow junction depths, thereby enabling the formation of transistors with very shallow source/drain junctions while preventing gate electrode depletion. As discussed previously, conventional semiconductor methodology comprising implanting impurities to form source/drain regions and to dope the gate electrode in the same ion implantation can result in $X_J$ increasing beyond the targeted maximum and/or gate electrode depletion.

Figure 1:
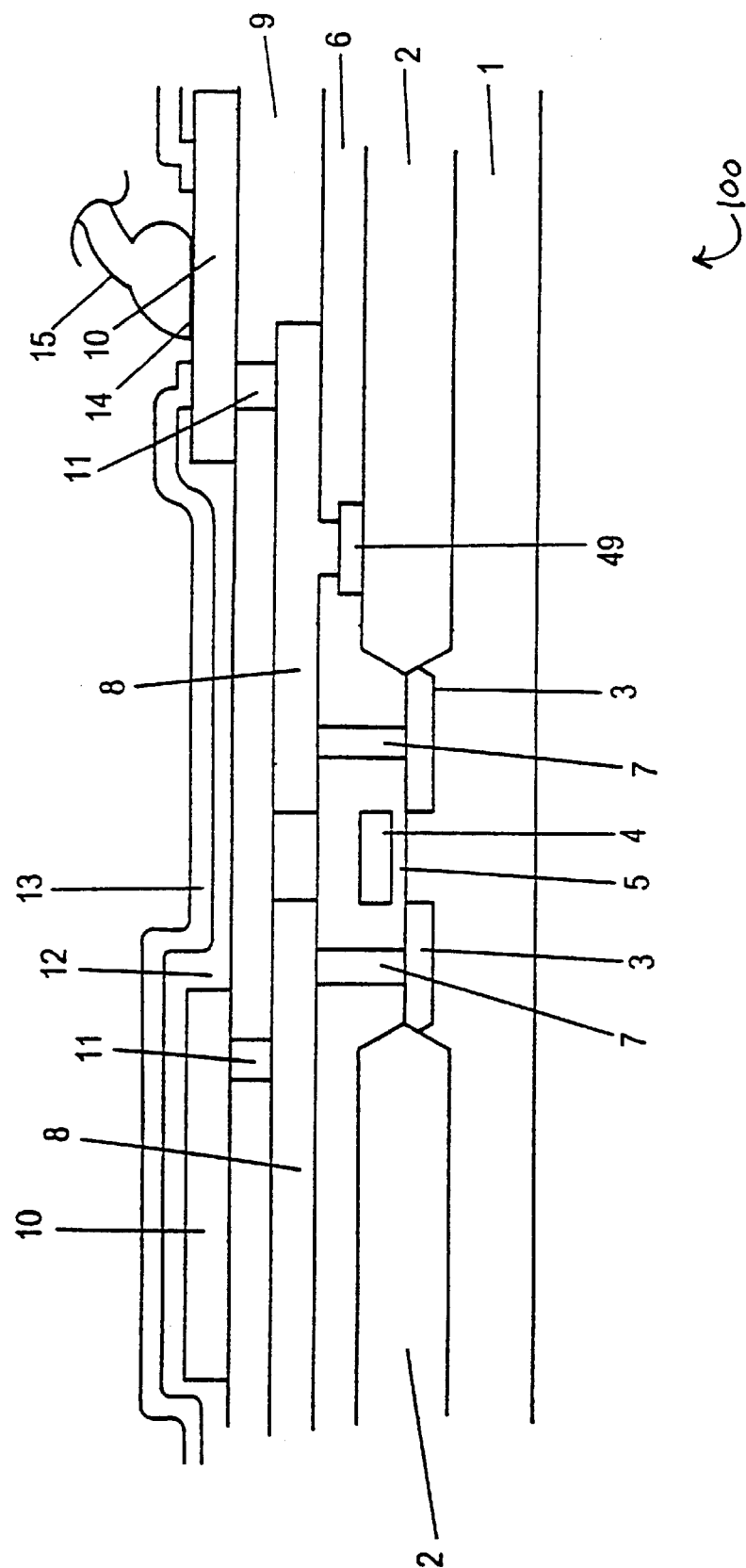
FIG. 1 schematically illustrates the cross-section of a conventional semiconductor device.
Figure 2:
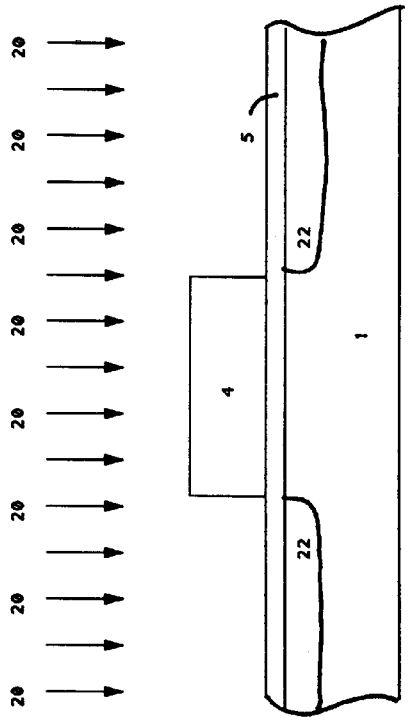
FIG. 2 illustrates the formation of shallow source/drain extensions according to an embodiment of the present invention.

In accordance with an embodiment of the present invention illustrated in FIG. 2, an initial gate dielectric layer 5, such as silicon oxide, is formed on semiconductor substrate 1 as in conventional practices. A gate electrode layer, such as polycrystalline silicon, is deposited and etched in a conventional manner to form gate electrode 4. Next, ion implantation is conducted to form shallow source/drain (S/D) extensions. Using gate electrode 4 as a mask, N-type impurities or P-type impurities are ion implanted, as indicated by arrows 20 in FIG. 2, at a relatively low energy to form S/D extensions 22.

For example, N-type impurities, such as arsenic, can be implanted at a dosage of about $5 \times 10^{13}$ atoms/cm$^2$ to about $5 \times 10^{15}$ atoms/cm$^2$ and an implantation energy of about 1 KeV to about 190 KeV to form S/D extensions 22 of an N-channel MOSFET. Other N-type impurities, such as phosphorous and antimony, can be implanted at various dosages and implantation energies based on the particular design requirements.

Alternatively, P-type impurities, such as boron and BF$_2$, can be implanted at a dosage of about $5 \times 10^{13}$ atoms/cm$^2$ to about $5 \times 10^{15}$ atoms/cm$^2$ and an implantation energy of about 0.2 KeV to about 190 KeV to form S/D extensions 22 of a P-channel MOSFET. Other P-type impurities, such as indium, can be implanted based on the particular design requirements.

Figure 3:
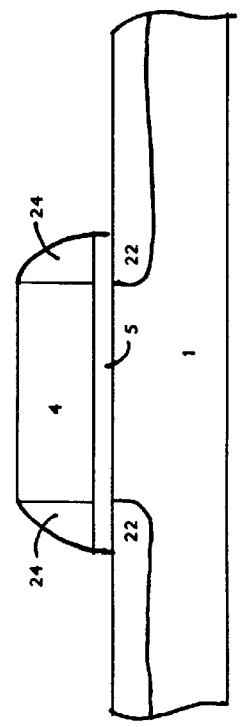
FIG. 3 illustrates the formation of sidewall spacers on the device of FIG. 2.

Subsequent to S/D extension implantation, a layer of dielectric material, such as a silicon oxide, a silicon nitride or a silicon oxynitride is deposited and anisotropically etched to form insulating sidewall spacers 24 on the side surfaces of gate electrode 4, as shown in FIG. 3. In forming sidewall spacers 24, gate oxide layer 5 is etched, thereby exposing the surface of semiconductor substrate 1 adjacent sidewall spacers 24.

The present invention departs from conventional methodology by forming a metal-silicide compound on the exposed silicon of gate electrode 4 and semiconductor substrate 1 prior to activation annealing, as compared to conventional practices forming titanium silicide after activation annealing has activated source/drain implants. Adverting to FIG. 4, after formation of sidewall spacers 24, a metal, such as titanium is deposited, e.g., by sputter deposition. Alternatively, another metal, such as cobalt, can be sputter deposited. A low temperature anneal, such as rapid thermal annealing (RTA), is then conducted to create a high-resistivity titanium silicide (TiSi$_x$) on the exposed silicon of gate electrode 4 and substrate 1, but not on spacers 24, typically an oxide. Unreacted titanium, e.g., on spacer 24, is then removed, e.g., by a wet strip. Next, a high temperature anneal, such as RTA at a temperature of about 400° C. to about 900° C. for about five seconds to about 60 seconds, is conducted to convert the titanium silicide into a low-resistivity TiSi$_x$, as indicated by XXX's in FIG. 4.

During the reaction to form the titanium silicide, silicon in gate electrode 4 and in substrate 1 is consumed. Advantageously, sidewall spacers 24 prevent silicon consumption in substrate 1 above shallow S/D extensions 22, thereby preventing the silicide from shorting through the shallow junctions.

The present invention further departs from conventional methodology by strategically forming a film having targeted thicknesses on the semiconductor device, after formation of the titanium silicide. The film facilitates subsequent gate electrode doping and source/drain formation. According to an embodiment of the present invention illustrated in FIG. 5, film 30, such as a spin-on glass (SOG), is deposited, e.g., by spin-on techniques. Alternatively, other spin-on materials can be used instead of SOG. Typically, in accordance with conventional spin-on techniques, a quantity of SOG is strategically deposited on the semiconductor. As the semiconductor is spun, film 30 becomes thicker above substrate 1 than above gate electrode 4, due to centrifugal forces.

Figure 5:
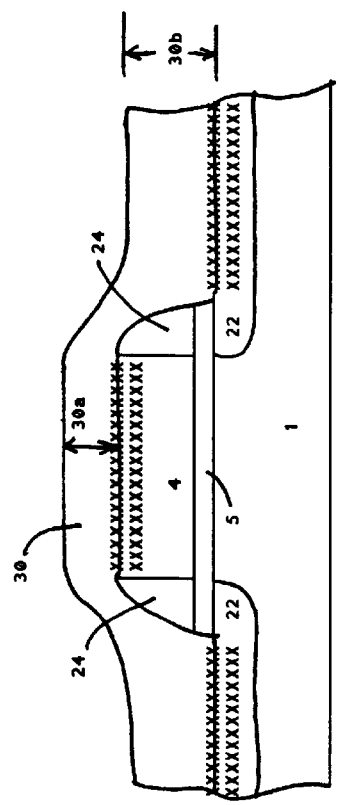
FIG. 5 illustrates the formation of film over the device of FIG. 4 according to an embodiment of the present invention.

The spin-on procedure is performed until film 30 achieves targeted thickness 30a above gate electrode 4 and targeted thickness 30b above substrate 1. Given the guidance and objectives disclosed herein, the particular amount of SOG deposited, as well as other application parameters, i.e., duration of spinning, can be readily optimized in a particular situation to achieve film 30 having targeted thicknesses 30a and 30b, as shown in FIG. 5. For example, it has been found suitable to form film 30a having a thickness of about 2,800 Å, e.g., to about 2800 Å and film 30b having a thickness therefore up to about 38000 Å, e.g., about 1000 Å to about 3800 Å.

In another embodiment of the present invention, an oxide, a nitride, an oxynitride or a photoresist film can be deposited, e.g., by chemical vapor deposition (CVD), to form film 30 having targeted thicknesses 30a and 30b. In order to achieve film 30 having the desired thicknesses, multiple depositions and selective etchings may be required. Alternatively, chemical-mechanical polishing (CMP) may be utilized after the film is deposited to achieve the desired thicknesses. Given the guidance and objectives disclosed herein, the particular number of depositions, as well as other application parameters, can be readily optimized in a particular situation to achieve film 30 having the targeted thicknesses.

In a further embodiment of the present invention, film 30 can be an oxide layer thermally grown to the targeted thicknesses. For example, a silicon oxide can be thermally grown on the semiconductor device to form an oxide film having targeted thicknesses, 30a and 30b. Given the guidance and objectives disclosed herein, the particular temperature and time employed for growing the oxide, as well as other application parameters, can be readily optimized in a particular situation to achieve film 30 having the targeted thicknesses.

After formation of film 30, e.g., by any of the methods described above or by another method to form a film having the targeted dimensions, ion implantation is conducted to dope gate electrode 4 and form source/drain regions. Adverting to FIG. 6, using gate electrode 4 and sidewall spacers 24 as a mask, N-type impurities or P-type impurities are ion implanted, as indicated by arrows 40, to form source/drain implants 42 and to dope gate electrode 4.

For example, N-type impurities such as arsenic or phosphorous, can be implanted at a dosage of about $5\times10^{14}$ atoms/cm$^2$ to about $1\times10^{16}$ atoms/cm$^2$ and an implantation energy of about 1 KeV to about 200 KeV e.g., about 10 KeV to about 60 KeV to form moderately-doped source/drain (MDD) implants 42 or heavily-doped source/drain (HDD) implants 42 of an N-channel MOSFET.

Alternatively, P-type impurities, such as boron, can be implanted at a dosage of about $5\times10^{14}$ atoms/cm$^2$ to about $1\times10^{16}$ atoms/cm$^2$ and an implantation energy of about 1 KeV to about 200 KeV, e.g., about 10 KeV to about 40 KeV to form the MDD/HDD implants 42 of a P-channel MOSFET. Other N-type or P-type impurities can be implanted at various dosages and implantation energies based on the particular design requirements.

Figure 6:
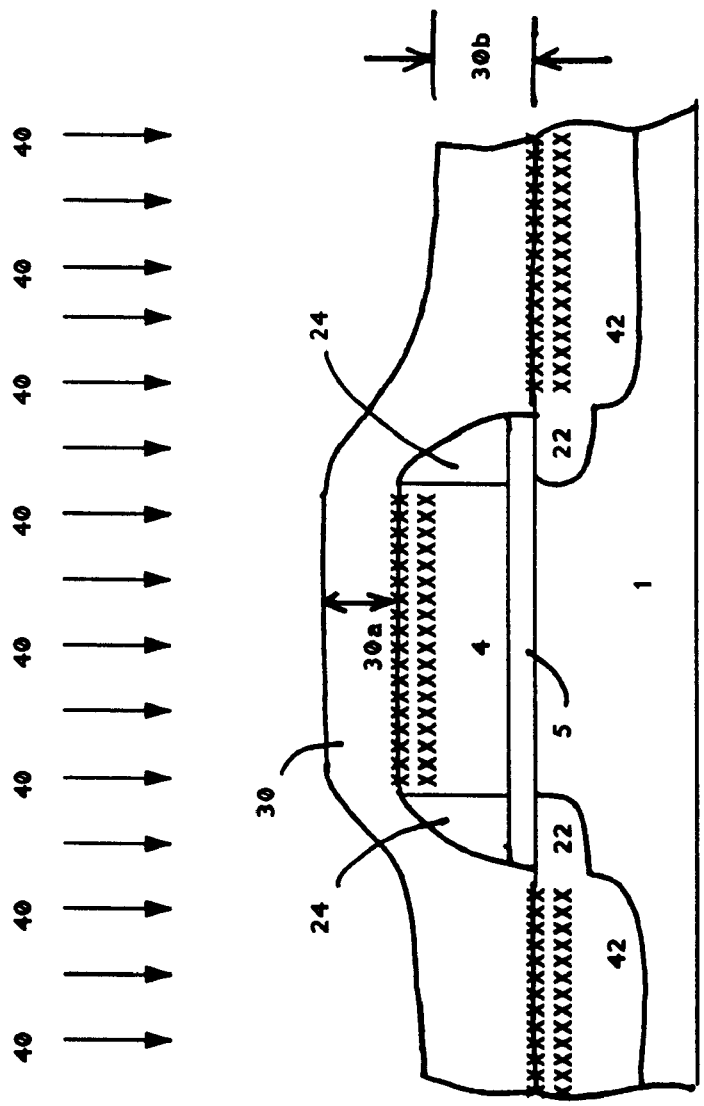
FIG. 6 illustrates impurity implantation to form source/drain regions according to an embodiment of the present invention.

Advantageously, by employing film 30 having the targeted thicknesses, the ion implantation step illustrated in FIG. 6 enables the implanted impurities to reach the desired depth in gate electrode 4, thereby reducing gate electrode depletion. Additionally, the implanted impurities reach the desired depth in semiconductor substrate 1 for S/D regions 42. Further, the implanted impurities experience less implant damage enhanced diffusion, since a significant portion of the implantation damage is to film 30 and the titanium silicide, not to the silicon in gate electrode 4 and substrate 1.

Adverting to FIG. 6, the depth of S/D implants 42 is shown to be deeper than the titanium silicide, indicated by XXX's. Alternatively, the depth of S/D implants 42 can be into the titanium silicide, based on the particular design requirements.

Subsequently, activation annealing is conducted to activate S/D extensions 22 and S/D implants 42. Annealing is typically performed at a temperature of about 900° C. to about 1100° C. to activate the impurity implanted regions 22 and 42, forming the source/drain regions in semiconductor substrate 1.

Figure 4:
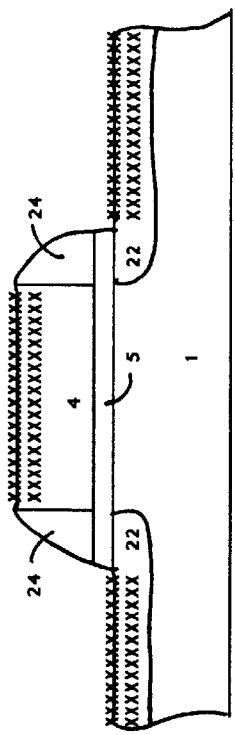
FIG. 4 illustrates the formation of titanium silicide according to an embodiment of the present invention.

In an alternative embodiment of the present invention, the ion implantation step illustrated in FIG. 6 is performed before the titanium silicide is formed. That is, the ion implantation to form the source/drain implants 42 is performed prior to the formation of the titanium silicide. Film 30 is then removed followed by formation of the titanium silicide, as illustrated in FIG. 4.

Thus, in accordance with the present invention, problems associated with forming shallow junctions are eliminated or substantially reduced. As a result, S/D extensions can achieve a desirably shallow $X_j$. Additionally, the formation of a strategic film prior to source/drain implantation enables the doping of the gate electrode and source/drain implantation to be performed in the same ion implantation. Advantageously, this saves processing time and increases manufacturing throughput. Further, forming a film prior to S/D implantation reduces damage to the silicon substrate during ion implantation and damage enhanced diffusion during subsequent annealing, thereby reducing source/drain $X_j$.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail, in order not to unnecessarily obscure the present invention.

The dielectric and conductive layers utilized in manufacturing a semiconductor device in accordance with the present invention can be deposited by conventional deposition techniques. For example, metallization techniques such as various types of chemical vapor deposition (CVD) processes, including low pressure chemical vapor deposition (LPCVD) and enhanced chemical vapor deposition (ECVD) can be employed.

The present invention enjoys applicability in the manufacturing of semiconductor devices and particularly in semiconductor devices comprising design features of 0.25 microns and under, with increased transistor and circuit speeds and improved reliability. The present invention is applicable to the formation of any of various types of semiconductor devices and, hence, details have not been set forth herein in order to avoid obscuring the thrust of the present invention. In practicing the present invention, conventional photolithographic and etching techniques are employed and, hence, the details of such techniques have not been set forth herein in detail.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises sequentially:

forming a dielectric layer on an upper surface of a semiconductor substrate;

forming a silicon layer on the dielectric layer;

patterning the silicon layer to form a gate electrode having an upper surface and side surfaces;

ion implanting impurities, using the gate electrode as a mask, to form source/drain extension implants in the semiconductor substrate;

depositing an insulating layer;

etching the insulating layer to form sidewall species on the side surfaces of the gate electrode;

depositing a metal on the semiconductor device;

reacting the metal with silicon in the gate electrode and in the semiconductor substrate to form a metal-silicide layer on the gate electrode and on the semiconductor substrate, before activation annealing the source/drain extension implants; and ion implanting impurities, using the gate electrode and sidewall spacers as a mask, to form moderately or heavily doped implants in the semiconductor substrate and to dope the gate electrode.

2. A method of manufacturing a semiconductor device, which method comprises sequentially:

forming a dielectric layer on an upper surface of a semiconductor substrate;

forming a silicon layer on the dielectric layer;

patterning the silicon layer to form a gate electrode having an upper surface and side surfaces;

ion implanting impurities, using the gate electrode as a mask, to form source/drain extension implants in the semiconductor substrate;

depositing an insulating layer;

etching the insulating layer to form sidewall species on the side surfaces of the gate electrode;

depositing a metal on the semiconductor device;

reacting the metal with silicon in the gate electrode and in the semiconductor substrate to form a metal-silicide layer on the gate electrode and on the semiconductor substrate, before activation annealing the source/drain extension implants;

forming a film over the semiconductor substrate and the gate electrode, the film having a first thickness over the gate electrode and a second thickness, greater than the first thickness, over the semiconductor substrate; and ion implanting impurities, using the gate electrode and sidewall spacers as a mask, to form moderately or heavily doped implants in the semiconductor substrate and to dope the gate electrode.

3. The method of claim 2, comprising:

ion implanting impurities through the film, using the gate electrode and sidewall spacers as a mask, to form moderately or heavily doped implants in the semiconductor substrate and to dope the gate electrode.

4. The method according to claim 3, comprising:

activation annealing to form source/drain regions comprising a source/drain extension region extending to a first depth below the surface of the semiconductor substrate and a moderately or heavily doped source/drain region extending to a second depth greater than the first depth.

5. The method according to claim 1, comprising ion implanting N-type impurities at an implantation dosage of about $5 \times 10^{13}$ atoms/cm$^2$ to about $5 \times 10^{15}$ atoms/cm$^2$ and an implantation energy of about 1 KeV to about 190 KeV to form the source/drain extension implants.

6. The method according to claim 1, comprising ion implanting P-type impurities at an implantation dosage of about $5 \times 10^{13}$ atoms/cm$^2$ to about $5 \times 10^{15}$ atoms/cm$^2$ and an implantation energy of about 0.2 KeV to about 190 KeV to form the source/drain extensions.

7. The method according to claim 1, wherein the metal comprises titanium or cobalt.

8. The method according to claim 2, wherein the first thickness is up to 2800 Å and the second thickness is up to 3800 Å.

9. The method according to claim 2, wherein the film comprises a spin-on glass.

10. The method according to claim 2, wherein the film comprises a photoresist material.

11. The method according to claim 2, wherein the film comprises an oxide, a nitride or an oxynitride.

12. The method according to claim 11, comprising depositing the film by chemical vapor deposition.

13. The method according to claim 2, comprising thermally growing the film.

14. The method according to claim 3, comprising ion implanting N-type impurities at an implantation dosage of about $5 \times 10^{14}$ atoms/cm$^2$ to about $5 \times 10^{15}$ atoms/cm$^2$ and an implantation energy of about 10 KeV to about 60 KeV to form the moderately or heavily doped implants and to dope the gate electrode.

15. The method according to claim 3, comprising ion implanting P-type impurities at an implantation dosage of about $5 \times 10^{14}$ atoms/cm$^2$ to about $5 \times 10^{15}$ atoms/cm$^2$ and an implantation energy of about 10 KeV to about 40 KeV to form the moderately or heavily doped implants and to dope the gate electrode.

* * * * *

UNITED STATES PATENT AND TRADEMARK OFFICE
CERTIFICATE OF CORRECTION

PATENT NO.    : 6,316,319 B1
DATED         : November 13, 2001
INVENTOR(S)   : Emi Ishida et al.

It is certified that error appears in the above-identified patent and that said Letters Patent is hereby corrected as shown below:

Column 7, claim 1,
Line 1, change "species" to -- spacers --;

Column 7, claim 2,
Line 12, change "species" to -- spacers --.

Signed and Sealed this

Ninth Day of April, 2002

Attest:

*Attesting Officer*

JAMES E. ROGAN
*Director of the United States Patent and Trademark Office*